United States Patent [19]
Okabe et al.

[11] Patent Number: 5,858,584
[45] Date of Patent: Jan. 12, 1999

[54] POSITIVE PHOTOSENSITIVE RESIN COMPOSITION AND ELECTRONIC APPARATUS USING THE SAME

[75] Inventors: Yoshiaki Okabe, Hitachi; Takao Miwa, Hitachinaka; Yasunari Maekawa, Hitachi; Takumi Ueno, Mito; Geraldine Rames-Langlade; Mina Ishida, both of Hitachi, all of Japan

[73] Assignees: Hitachi, Ltd.; Hitachi Chemical Co., Ltd., both of Tokyo, Japan

[21] Appl. No.: 857,675

[22] Filed: May 16, 1997

[30] Foreign Application Priority Data

May 27, 1996 [JP] Japan ..................................... 8-132042

[51] Int. Cl.$^6$ ....................................................... G03F 7/023
[52] U.S. Cl. ............................ 430/18; 430/192; 430/193; 430/326; 430/330
[58] Field of Search ..................................... 439/192, 193, 439/326, 330, 18

[56] References Cited

U.S. PATENT DOCUMENTS

| | | | |
|---|---|---|---|
| 4,774,171 | 9/1988 | Zahn et al. | 430/192 |
| 5,441,845 | 8/1995 | Okinoshima et al. | 430/192 |
| 5,518,864 | 5/1996 | Oba et al. | 430/192 |
| 5,573,886 | 11/1996 | Kato et al. | 430/192 |

FOREIGN PATENT DOCUMENTS

| | | |
|---|---|---|
| 0547555 | 6/1993 | European Pat. Off. . |
| 4168441 | 6/1992 | Japan . |
| 5339373 | 12/1993 | Japan . |

*Primary Examiner*—John S. Chu
*Attorney, Agent, or Firm*—Antonelli, Terry, Stout & Kraus, LLP

[57] ABSTRACT

A highly reliable positive type photosensitive resin composition composed of diamine having a carboxyl group as a structural unit, which can be developed with an alkaline aqueous solution, comprising polyamic acid ester having hydrophobic group, o-quinonediazidesulfonyl amide compound, and/or o-quinonediazidesulfonyl amide sulfonic ester compound, and electronic devices using the same. A polyamide film having preferable positive type relief patterns, of which the unexposed portion is not corroded, can be obtained.

10 Claims, 1 Drawing Sheet

POSITIVE PHOTOSENSITIVE RESIN COMPOSITION AND ELECTRONIC APPARATUS USING THE SAME

BACKGROUND OF THE INVENTION

The present invention relates to a positive type photosensitive resin composition, which is suitable for using in electric or electronic devices, particularly in semiconductor devices, and which is developable by an alkaline aqueous solution.

Currently, polyimide has been used widely in the field of semiconductor manufacture, which requires strict reliability, because polyimide is superior in heat-resistance, mechanical strength, and electrical insulation to other materials.

The utilization of polyimide as a passivation film, a buffer-coating film an α-ray shielding film an insulating film between layers, and so on in the semiconductor field is well known. In case of the utilization, a process for manufacturing fine through-holes in the polyimide film is necessary for forming a path through the upper and the lower conductive layers, or for connecting an external lead wire. Therefore, generally, a chemical etching treatment of the polyimide film using a photoresist is performed.

However, pattern formation of the polyimide film requires application and stripping of the photoresist, and the series of process steps is complex. Therefore, a photosensitive polyimide, which is capable of being formed by a short process and of being manufactured finely, has been required. As the results of extensive developing efforts devoted by many manufacturers to respond this requirement, a negative type photosensitive polyimide, which can be developed in an organic solvent, came to be commercialized. However, currently, in view of the high efficiency of the facility and current global environmental problems, a positive type photosensitive polyimide, which can not be developed in an organic solvent, but requires an alkaline aqueous solution, has come to be required.

A positive type photosensitive polyimide can be divided into two categories including, in which a photosensitive group is introduced into the polyimide precursor (JP-B-1-59571 (1989)), and another to which a photosensitive group is added. As for the latter positive type photosensitive polyimide of the photosensitive group addition type, one composed of o-quinonediazidesulfonic acid ester (JP-A-4-168441 (1992), JP-A-4-204738 (1992)), which generates carboxylic acid by light irradiation, and one composed of a polyimide precursor added with dihydroxypyridine derivatives (JP-A-6-43648 (1994)), and others have been disclosed. However, all of the above photosensitive imide have problems in resolution, sensitivity, and so on. The above o-quinonediazidesulfonic acid ester is a photosensitive agent used as a photoresist, and both a dissolution hindrance effect in the unexposed region and a dissolution enhancing effect in the exposed region as the photosensitive agent of the polyimide precursor are insufficient.

Particularly, the positive type photosensitive polyimide had a special problem, which did not exist in the negative type, such that the unexposed region was corroded at its substrate portion in the developing process, because the exposed region was dissolved when the positive type was used. As countermeasures for the problem, a method of mixing a silan group coupling agent such as 3-aminopropylmethoxysilan into the photosensitive resin composition, and a method improving the adhesiveness at the development by using a surface treated substrate are well known. However, in the case of a semiconductor, such a surface treatment is impossible, and the mixing of a coupling agent with the photosensitive resin composition is also not so effective.

As explained above, various attempts to add a photosensitivity of the positive type to the polyimide which can be developed by an alkaline aqueous solution have been performed, but sufficient results could not be obtained.

SUMMARY OF THE INVENTION

One of the objects of the present invention is to provide a positive type photosensitive resin composition, which can be formed by a short process, which has a superior dissolution hindrance effect in the unexposed region and a superior dissolution enhancing effect in the exposed region, which is capable of being manufactured finely, and which is an alkaline development type having a high reliability, and electronic devices using the same.

In view of the above object, the inventors have studied extensively the solubility of various combinations of a base polymer and photosensitive groups in an alkaline aqueous solution. As a result, it was found that a polyamic acid ester (PAE), which is insoluble itself into an alkaline aqueous solution, when mixed with diamine having a carboxylic acid with a designated fraction in order to give an adequate solubility to PAE and a hydrophobic group in order to obtain a clear relief pattern, is preferable as base polymer, because the boundary portion between the exposed region and the unexposed portion is clearly divided and fine manufacturing becomes possible.

Further, it was found that o-quinonediazidesulfonyl amide compounds or their sulfonic ester compounds, which change to indenecarboxylic acid, which is soluble in an alkaline aqueous solution, by light irradiation, is superior as a photosensitive agent to conventional o-quinonediazidesulfonic acid ester, because the dissolution hindrance effect in the unexposed region and the dissolution enhancing effect in the exposed region are improved, and because they are sensitive to a small exposure of light.

Furthermore, it was found that a positive type photosensitive resin composition, which has a controlled solubility of the exposed region, and which is capable of forming a clear relief pattern, can be obtained by combining the above PAE and the o-quinonediazidesulfonyl amide compounds or their sulfonic ester compounds, leading to the development of the present invention.

The present invention relates to a positive type photosensitive resin composition, which can be developed by an alkaline aqueous solution, comprising a polyamic acid ester expressed by the following general formula (I):

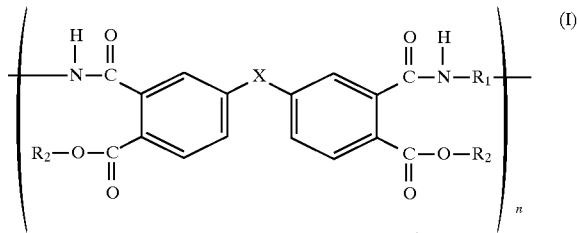

where, $R_1$: a divalent organic group (however, 55~85 mol % of the $R_1$ contain carboxyl group)
$R_2$: a hydrophobic group
X: —O—, —C(=o)—, or direct bond
n: 6~570 an o-quinonediazidesulfonyl amide compound expressed by the following general formula (II):

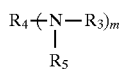

where, $R_3$: an o-quinonediazidesulfonic group
$R_4$: an organic group of carbon atoms 2~30
$R_5$: an alkyl group or hydrogen
m: 1~6 and/or an o-quinonediazidesulfonyl amide sulfonic ester compound expressed by the following general formula (III):

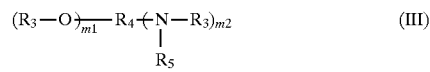

where, $R_3$: an o-quinonediazidesulfonic group
$R_4$: an organic group of carbon atoms 2~30
$R_5$: an alkyl group or hydrogen
$m_1$: 1~5
$m_2$: 1~6

Further, the present invention relates to positive type photosensitive resin composition varnish comprising the above positive type photosensitive resin composition and an organic solvent, wherein the total concentration of the polyamic acid ester, the o-quinonediazidesulfonyl amide compound, and/or the o-quinonediazidesulfonyl amide sulfonic ester compound is in the range of 5~45% by weight.

Furthermore, the present invention relates to polyimide film obtained by the above positive type photosensitive resin composition varnish.

Furthermore, the present invention relates to a method of manufacturing a polyimide film comprising the steps of applying the above positive type photosensitive resin composition varnish onto a solid body, prebaking the applied solid body, exposing the solid body to light using a photomask having a desired pattern, etching the exposed solid body with an alkaline solution, and heat treating the etched solid body.

Furthermore, the present invention relates to an electronic apparatus comprising the above polyimide film.

Hereinafter, details of the present invention will be explained.

[1] Base polymer

The base polymer of the positive type photosensitive resin composition of the present invention is the polyamic acid ester (PAE) expressed by the following general formula (I):

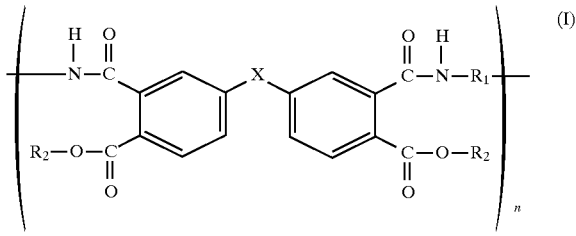

where, $R_1$: a divalent organic group (however, 55~85 mol % of the $R_1$ contain carboxyl group)
$R_2$: a hydrophobic group
X: —O—, —C(=o)—, or direct bond
n: 6~570

The component $R_1$ in the general formula (I) comprises a diamine with an adjacent N-H group, and 55~85 mol % of the $R_1$, that is, 55~85 mol % of the diamine contain carboxyl groups. If the diamine containing the carboxylic group is less than 55 mol %, the solubility of the PAE in the alkaline aqueous solution is insufficient, and the developing time becomes long. On the contrary, if the diamine containing the carboxylic group is more than 85 mol %, the solubility of the PAE in the alkaline aqueous solution is too large, and problems such as corrosion of the unexposed portion, and reduction of film thickness are generated.

The component $R_2$ in the general formula (I) is a hydrophobic group. Examples of a hydrophobic group are, for instance, alkyl groups of carbon atoms number 3~12, cycloaliphatic hydrocarbon groups, aromatic groups, fluorinated alkyl groups, and the like. The PAE having such a hydrophobic group is effective in forming a preferable relief pattern at the development.

For instance, when the hydrophobic group is an alkyl group (an alkyl ester group in the PAE) of carbon atoms number 3~12, an imidizing temperature is elevated in accordance with an increase on the number of carbon atoms of the alkyl ester group of the PAE (High polymer, Vol. 50, No. 12, pp. 947–952 (1993)). Therefore, when a resin composition varnish containing the PAE is applied onto a substrate, and the substrate is prebaked for vaporizing the solvent, the imide fraction of the PAE is not increased, and a preferable positive type relief pattern can be obtained. If the number of carbon atoms in the alkyl ester group is less than 2, the imide fraction is increased by the prebaking, and a preferable relief pattern is hard to be obtained. If the number of carbon atoms exceeds 12, the hydrophobic property becomes too strong, and a preferable relief pattern is hard to be obtained.

When an organic solvent is used as a developing solution, the development can be achieved even if the imide fraction is increased during the prebaking, because the organic solvent has a high solubility for the polyimide precursor. On the contrary, an alkaline aqueous solution has a low solubility for the polyimide precursor, and a small increase in the imide fraction has a significant influence on the pattern formation, when an alkaline aqueous solution is used as the developing solution like the present invention.

When the hydrophobic group is an alkyl group when the carbon atoms number 3~12, an adequate balance between the hydrophobic group in the alkyl group and the hydrophilic carboxylic group in the $R_1$ group is achieved, and a preferable relief pattern can be formed.

The average molecular weight (hereinafter, a weight average molecular weight, Mw is indicated) of the PAE of the present invention is desirably in the range of 8,000~200,000 in stylene converted value by GPO (Gel Permeation Chromatography). If Mw is less than 8,000, the mechanical strength of the polyimide is insufficient and improper for practical use, and if Mw exceeds 200,000, the developing time is extended too long, and a preferable positive type relief pattern can hardly be obtained.

The method for preparing the PAE of the present invention is not restricted to any special method. When the $R_2$ in the component general formula (I) is an alkyl group of carbon atoms number 3~12, generally, a tetracarboxylic acid is synthesized from a tetracarboxylic acid dianhydride and an alcohol, the carboxylic acid is chlorinated by a chlorinating agent such as thionyl chloride, and the chloride is reacted with a diamine.

As the tetracarboxylic acid dianhydride, any tetracarboxylic acid dianhydride which is generally used for the photosensitive polyimide can be used. However, in the present invention, 3,3',4,4'-benzophenone tetracarboxylic acid dianhydride, 3,3',4,4'-diphenylethertetracarboxylic acid dianhydride, or 3,3',4,4'-biphenyltetracarboxylic acid dianhydride are preferably used. The positive type photosensitive resin composition varnish using the above tetracarboxylic acid dianhydride is advantageous in adhesiveness to the unexposed substrate during the development by an alkaline aqueous solution. Especially, 3,3,'4,4'-benzophenone tetracarboxylic acid dianhydride is particularly desirable, because it has preferable adhesiveness between the unexposed portion and the substrate during the development, and it is not corrosive.

As the alcohol to be reacted with the above tetracarboxylic acid dianhydride, an aliphatic group alcohol of carbon atoms number 3~12 can be used. For instance, propanol, buthanol, pentanol, hexanol, heptanol, octanol, nonaol, decanol, undecanol, dodecanol, and so on, and primary alcohol, secondary alcohol, tertially alcohol, and alcohol of an arbitrary hydroxy group position of the above alcohol can be used.

As the diamine having a carboxyl group, 3,5-diaminobenzoic acid, 2,5-diaminobenzoic acid, 2,5-diaminoterephthalic acid, and the like can be used. As general diamines, there are p-phenylenediamine, p,p'-diaminodiphenylether, p'-diamino-ter-phenyl, bis[4-(3-aminophenoxy)phenylsulfon], 2,4-diamino-toluene, m,m'-diaminobenzophenone, m-phenylenediamine, 2,2'-bis[(4-p-aminophenoxy)phenyl]propane, bis-4-aminophenoxy-4-phenylsulfone, 3,3'-diaminobenzophenone, 2,2'-bis[4-(3-aminophenoxy)phenyl]hexafluoropropane, 1,3-bis(3-aminophenoxy)benzene, 2,2-bis[(3-aminophenoxy)phenyl]propane, and the like.

When a polyimide film is formed with the present PAE using a silicon substrate, a self-adhesion type diamine, which has preferable adhesiveness with the silicon substrate, can be mixed with the above diamine. As the self-adhesion type diamine, 1,3-bis(3-aminopropyl)tetramethyldisiloxane, 1,3-bis(3-aminophenyl)tetramethyldisiloxane, 1,3-bis(3-aminopropyl)tetraphenyldisiloxane, 1,3-bis(3-aminophenyl)tetraphenyldisiloxane, and the like can be used. A decrease in mechanical strength of the polyimide film can be prevented by adding an amount of self-adhesion type diamine, which amount is less than 15 mol % of the diamine component in the polyimide precursor.

As the chlorinating agent, phosphorous trichloride, phosphorous pentachloride, and the like can be used in addition to thionyl chloride.

[2] photosensitive agent

As a photosensitive agent in the positive type photosensitive resin composition, an o-quinonediazide sulfonyl amide compound expressed by the following general formula (II):

where, $R_3$: an o-quinonediazidesulfonic group
$R_4$: an organic group of carbon atoms 2~30
$R_5$: an alkyl group or hydrogen
m: 1~6
and/or an o-quinonediazidesulfonyl amide sulfonic ester compound expressed by the following general formula (III):

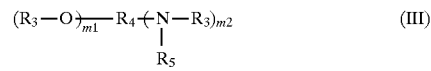

where, $R_3$: an o-quinonediazidesulfonic group
$R_4$: an organic group of carbon atoms 2~30
$R_5$: an alkyl group or hydrogen
$m_1$: 1~5
$m_2$: 1~6
or their mixture can be used.

When the $R_5$ in the component general formula (II) or (III) is an alkyl group, the number of carbon atoms is desirably restricted to 10 at the utmost, and particularly, the number is restricted at the utmost to 8, in order to prevent dissolution of the unexposed portion during the development.

The above o-quinonediazidesulfonyl amide compound and o-quinonediazidesulfonyl amide sulfonic ester compound generate carboxyl groups by light irradiation to realize the dissolution enhancing effect of PAE at the exposed portion, and react as a light dissolution controlling agent of PAE. The sulfonyl amide portion enhances the solubility into the alkaline aqueous solution and, particularly, improves the dissolution enhancing effect at the exposed portion. The dissolution rate of the exposed portion and the unexposed portion can be controlled by altering the kind of substituted group, the number of the substitution, and the containing ratio of the sulfonyl amide and sulfonic ester.

Examples of the o-quinonediazidesulfonyl amide compound usable in the present invention are, for instance, 4,4'-bis(1,2-naphthoquinone-2-diazide-5-sulfonylamino)diaminodiphenylether, 4-(1,2-naphthoquinone-2-diazide-5-sulfonylamino)-1-(1,2-naphthoquinone-2-diazide-5-sulfonyloxy)benzene, N-methyl-1,2-bis(1,2-naphthoquinone-2-diazide-5-sulfonylamino)ethane, 2-(1,2-naphthoquinone-2-diazide-5-sulfonylamino)-1-(1,2-naphthoquinone-2-diazide-5-sulfonyloxy)ethane, 2,2-bis(4-(p-(1,2-naphthoquinone-2-diazide-5-sulfonylamino)phenoxy)phenyl)propane, 2,2-bis(4-(p-(1,2-naphthoquinone-2-diazide-5-sulfonylamino)phenoxy)phenyl)hexafluoropropane, m-xylylenedi(1,2-naphthoquinone-2-diazide-5-sulfonylamine), p-xylylenedi(1,2-naphthoquinone-2-diazide-5-sulfonylamine), and the like.

Example of the o-quinonediazidesulfonyl amide sulfonic ester compound usable in the present invention are, for instance, 2-(1,2-naphthoquinone-2-diazide-5-sulfonylamino)-1-(1,2-naphthoquinone-2-diazide-5-sulfonyloxy)benzene, 3-(1,2-naphthoquinone-2-diazide-5-sulfonylamino)-1-(1,2-naphthoquinone-2-diazide-5-sulfonyloxy)benzene, 4-(1,2-naphthoquinone-2-diazide-5-sulfonylamino)-1-(1,2-naphthoquinone-2-diazide-5-sulfonyloxy)benzene, 4-(1,2-naphthoquinone-2-diazide-5-sulfonylamino)-1-(1,2-naphthoquinone-2-diazide-5-sulfonyloxy)butane, 2,4-(1,2-naphthoquinone-2-diazide-5-sulfonylamino)-1-(1,2-naphthoquinone-2-diazide-5-sulfonyloxy)butane, 5-(1,2-naphthoquinone-2-diazide-5-sulfonylamino)-1-(1,2-naphthoquinone-2-diazide-5-sulfonyloxy)pentane, 5-(1,2-naphthoquinone-2-diazide-5-sulfonylamino)-2-(1,2-naphthoquinone-2-diazide-5-sulfonyloxy)pentane, N-methyl-5-(1,2-naphthoquinone-2-diazide-5-sulfonylamino)-2-(1,2-naphthoquinone-2-diazide-5-sulfonyloxy)pentane, 2-(1,2-naphthoquinone-2-diazide-5-sulfonylamino)-1-(1,2-naphthoquinone-2-diazide-5-sulfonyloxy)cyclohexane, 3-(1,2-naphthoquinone-2-diazide-5-sulfonylamino)-1-(1,2-naphthoquinone-2-diazide-5-sulfonyloxy)cyclohexane, 4-(1,2-naphthoquinone-2-diazide-5-sulfonylamino)-1-(1,2-naphthoquinone-2-diazide-5-sulfonyloxy)cyclohexane, and the like.

The o-quinonediazidesulfonyl amide compound expressed by the following general formula (II) and the o-quinonediazidesulfonyl amide sulfonic ester compound expressed by the following general formula (III) are generally prepared by a condensation reaction of o-quinonediazidesulfonyl chloride with a diamine compound or an amine compound containing a hydroxyl group.

As the o-quinonediazidesulfonyl chloride, there are, for instance, 1,2-naphthoquinone-2-diazide-4-sulfonic acid chloride, 1,2-naphthoquinone-2-diazide-5-sulfonic acid chloride, and the like.

The compounds which react with the above o-quinonediazidesulfonyl chloride to obtain the o-quinonediazidesulfonyl amide compound are, for instance, aniline, benzylamine, 1-naphthylamine, 2-naphthylamine, hexylamine, octylamine, dodecylamine, octadecylamine, 1,3-diaminobenzene, 1,4-diaminobenzene, 4,4-diaminobiphenyl, 4,4-diaminodiphenylmethane, 4,4-diaminodiphenylether, 4,4-diaminodiphenylketone, 4,4-diaminodiphenylsulfone, 2,2-bis(4-aminophenyl)propane, 2,2-bis(4-aminophenyl)-1,1,1,3,3,3-hexafluoropropane, bis(4-aminopropyl)tetramethyldisiloxane, 1,2,4-triaminobenzene, 1,3,5-triaminobenzene, 3,4,4'-triaminodiphenylether, 3,3',4,4'-diaminodiphenyl, 3,3',4,4'-tetradiaminodiphenylether, 1,2-diaminoethylene, N,N'-dimethyl-1,2-diaminoethylene, 1,3-diamonopropane, 1,4-diamonobutane, N,N'-dimethyl-1,4-diaminobutane, 1,6-diaminohexane, 1,8-diaminooctane, 1,10-diaminodecane, 1,12-diaminododecane, 2-butyl-2-ethyl-1,5-pentanediamine, 4-aminomethyl-1,8-diaminooctane, diethylenetriamine, bis(hexamethylene) triamine, triethylenetetramine, tetraethylenepentamine, and the like.

The compounds which are usable for obtaining the o-quinonediazidesulfonyl amide sulfonic ester compound are, for instance, 2-aminophenol, 3-aminophenol, 4-aminophenol, 2,3-diaminophenol, 2,4-diaminophenol, 4-aminoresorcinol, 4,4'-diamino-3,3'-dihydroxybiphenyl, 3,3'-diamino-4,4'-dihydroxybiphenyl, 2-aminoethanol, N-methyl-2-aminoethanol, 3-aminopropanol, 2-aminobutanol, 2-amino-3-methylbutanol, 4-aminobutanol, 5-aminopentanol, 6-aminohexanol, 4-aminocyclohexanol, 2-aminoheptanol, 6-amino-2-methyl-2-heptanol, 8-aminooctanol, 10-aminodecanol, 12-aminododecanol, 1-amino-2,3-propanediol, 2-amino-1,3-propanediol, 2-amino-2-ethyl-1,3-propanediol, bis-homotris(hydroxymethyl)aminomethane, and the like.

[3] Positive type photosensitive resin composition

The positive type photosensitive resin composition of the present invention includes the polyamic acid ester, the o-quinonediazidesulfonyl amide compound, and/or the o-quinonediazidesulfonyl amide sulfonic ester compound explained above. The mixing ratio of the o-quinonediazidesulfonyl amide compound and/or the o-quinonediazidesulfonyl amide sulfonic ester compound to the polyamic acid ester is preferably in the range of 5~40% by weight. If it exceeds 40% by weight, the mechanical strength of the obtained polyimide film is insufficient, and if it is less than 5% by weight the, sensitivity to the exposure is insufficient and the radiation dose must be increased.

The positive type photosensitive resin composition of the present invention can be developed by an alkaline aqueous solution. Therefore, the resin composition has a much less harmful influence on human bodies and the environment than organic solvents. As the alkaline aqueous developing solution, a hydroxy quaternary ammonium aqueous solution, such as tetraammonium hydroxide, tetraethylammonium hydroxide, and the like, and an amine group aqueous solution, such as ethanolamine, propylamine, and the like, are usable. Generally, a tetraammonium hydroxide 2.38% aqueous solution is used mostly.

[4] Positive type photosensitive resin composition varnish

In order to form a polyimide film with the positive type photosensitive resin composition of the present invention, the positive type photosensitive resin composition is dissolved into an organic solvent, preferably into a polar solvent to form varnish, and the varnish is used for forming the polyimide film. The mixing ratio of the positive type photosensitive resin composition and the organic solvent is determined in consideration of the film thickness required for the film and the application performance. Generally, it is desirable to mix the positive type photosensitive resin composition and the organic solvent so that the total concentration (called as NV, hereinafter) of the polyamic acid ester, o-quinonediazidesulfonyl amide compound and/or the o-quinonediazidesulfonyl amide sulfonic ester compound contained in the positive type photosensitive resin composition is in the range of 5~45% by weight in the varnish. When the NV exceeds 45% by weight, the viscosity of the varnish becomes too high, and problems such as difficult control of the film thickness, and residual voids are generated. When the NV is less than 5% by weight, it is difficult to obtain a polyimide film having a uniform film thickness of more than 3.0 $\mu$m.

The positive type photosensitive resin composition varnish of the present invention can be prepared by mixing the PAE, the o-quinonediazidesulfonyl amide compound, and/or the o-quinonediazidesulfonyl amide sulfonic ester compound into a polar organic solvent with agitation.

As the polar solvent, N-methyl-2-pyrrolidone, N,N'-dimethylacetoamide, dimethylformamide, dimethylsulfoxide, acetonitrile, diglyme, $\gamma$-butyrolactone, phenol, toluene, dioxane, tetrahydrofuran, sulfolane, hexamethylphosphoramide, and the like are usable.

[5] Polyimide film

The polyimide film of the present invention can be formed with the above positive type photosensitive resin composition varnish. First, the positive type photosensitive resin composition varnish of the present invention is applied onto a solid body, generally a substrate, such as a glass plate or a silicon wafer, by a method, such as spin coating and others. The film thickness is desirably about 0.5~20 $\mu$m.

After the application, a prebaked film is formed by prebaking the applied film at a temperature in the range of 40°~90° C. for 1~6 minutes in order to evaporate the solvent to some extent. Subsequently, the film is irradiated with ultraviolet rays via a photomask having a desired pattern. By using the positive type photosensitive resin composition (varnish), the exposure can be completed with a small dose, practically, such as 100~400 mJ/cm$^2$.

After the exposure with ultraviolet rays, the film is immersed into an alkaline aqueous solution, as described previously, to perform etching on the exposed portion. When the positive type photosensitive resin composition (varnish) is used, edges of the pattern are cut clearly, because the composition is superior in the dissolution hindrance effect at the unexposed portion and the dissolution enhancing effect at the exposed portion, and a polyimide film having the desired pattern can be obtained. For instance, when a photomask having a pattern of 100 $\mu$m is used, the obtained pattern of polyimide film can be within the range of 97~103 $\mu$m.

After the etching, the film is washed with water, and the polyimide film can be obtained by thermal imide formation. The temperature for the thermal imide formation after the development is desirably in the range of 200°~450° C., particularly the range of 300°~450° C. is preferable. In accordance with the present invention, the o-quinonediazidesulfonyl amide compound, and/or the o-quinonediazidesulfonyl amide sulfonic ester compound in the unexposed portion is evaporated partly, and carboxyl groups in the polyamic acid ester is decomposed to generate carbon dioxide during the thermal imide formation. Therefore, a polyimide film which is superior in its insulating property and heat resistant can be obtained.

As explained above, the positive type photosensitive resin composition (varnish) of the present invention can be developed with an alkaline aqueous solution, and a polyimide film having a fine and reliable positive type relief pattern can be formed.

[6] Electronic apparatus

The polyimide film formed from the positive type photosensitive resin composition (varnish) of the present invention can be utilized as an insulating film for use in various electronic apparatus, such as an inter-layer insulating film, a passivation film for semiconductor devices, an insulating film for multilayer printing substrates, and the like. Examples of such an electronic apparatus, are, for example, microcomputers, memories, gate arrays, logic, and the like. As the mounting condition, there are, for example, PGA (pin grid array), QFP (quad flat package), SOJ (small outline-j-bended package), SOP (small outline package), TSOP (thin small outline package), TQFP (thin quad flat package), ZIP (zigzag in-line package), BGA (ball grid array), CSP (chip size package), COB (chip on board), and the like.

A set of schematic illustrations of processes for manufacturing a resin sealed semiconductor device, which is an example of the electronic apparatus of the present invention, is indicated as FIGS. 1(a)~1(d).

(a) A stratified substrate of LSI chip 2 on a tab 3, bonding pads 1a,1b on the LSI chip 2, is prepared.

(b) The positive type photosensitive resin composition varnish 4 is applied onto the surface of the LSI chip 2 so as to coat the bonding pads 1a and 1b.

(c) After prebaking, the applied varnish is exposed to light using a photomask having through-holes at locations corresponding to the bonding pads 1a and 1b. Then, etching with an alkaline aqueous solution and thermal treatment are performed. Through-holes 50 are formed in the fabricated polyimide film 5 at the location corresponding to the bonding pads 1a and 1b.

(d) Each of the bonding pads 1a and 1b is connected with lead frame 7 by a bonding wire 6 through the through-hole 50. Then the resin sealed semiconductor device can be formed by molding the whole body with a sealing agent 8.

BRIEF DESCRIPTION OF THE DRAWINGS

These and other objects, features and advantages of the present invention will be understood more clearly from the following detailed description with reference to the accompanying drawings, wherein.

DESCRIPTION OF THE PREFERRED EMBODIMENTS

Figure 1A:
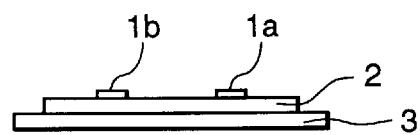
FIGS. 1(a)~1(d) are schematic diagrams illustrating steps in the manufacture of a resin sealed semiconductor device using the positive type photosensitive resin composition of the present invention.

Hereinafter, embodiments of the present invention will be explained in detail, but the scope of the present invention is not restricted by the specific embodiments.

Abbreviations of the compounds used in the embodiments and the comparative examples are as follows:

3,3',4,4'-Benzophenone tetracarboxylic acid dianhydride→BTDA
3,3',4,4'-Diphenylether tetracarboxylic acid dianhydride→ODPA
3,3',4,4'-Biphenyl tetracarboxylic acid dianhydride→BPDA
Methyl alcohol→MeOH
Propyl alcohol→PrOH
Butyl alcohol→BuOH
Hexyl alcohol→HeOH
Octyl alcohol→OcOH
Dodecyl alcohol→DoOH
3,5-diamino-benzoic acid→DABA
p,p'-diaminodiphenylether→DDE
2,2'-bis((4,4-aminophenoxy)phenyl)propane→DAPP
1,3-bis(3-aminopropyl)tetramethyldisiloxane→BAT
n-methyl-2-pyrrolidone→NMP
4,4'-bis(1,2-naphthoquinone-2-diazide-5-sulfonyl amino) diaminodiphenylether→DDE-Q
4-(1,2-naphthoquinone-2-diazide-5-sulfonylamino)-1-(1, 2-naphthoquinone-2-diazide-5-sulfonyloxy) benzene→AMP-Q
N-methyl-1,2-bis(1,2-naphthoquinone-2-diazide-5-sulfonylamino)ethane→MEDA-Q
2-(1,2-naphthoquinone-2-diazide-5-sulfonylamino)-1(1, 2-naphthoquinone-2-diazide-5-sulfonyloxy) ethane→AME-Q An ester compound of 1,2-naphthoquinone-2-diazide-5-sulfonic acid chloride and 2,3,4,4'-tetrahydroxybenzophenone→4NT-300 (made by Toyo Gosei Co.)

(Embodiment 1)

BTDA 12.35 g (0.03833 mol) was mixed with 1-BuOH 12.0 g, the mixture was refluxed for one hour, and butyl ester of 3,3',4,4'-benzophenone tetracarboxylic acid was obtained by removing excess 1-BuOH by reducing pressure. The ester was mixed with purified thionyl chloride 12.0 g (0.09 mol), the mixture was refluxed for one hour, and butyl ester dichloride of 3,3',4,4'-benzophenone tetracarboxylic acid 27,2 g was obtained by removing excess thionyl chloride. Then, NMP 27.2 g was added to the butyl ester dichloride for dissolving, and an acid chloride 50% solution was obtained.

On the other hand, 3,5-DABA 3.50 g (0.023 mol), DDE 2.68 g (0.0134 mol), BAT 0.48 g (0.0019 mol), and NMP 45 g were mixed together (DABA/DDE/BAT/=60/35/5), and the obtained solution was designated as the diamine solution. The acid chloride solution was added to the diamine solution, which was cooled below 10° C., slowly dropwise for 1 hour, and agitated for more one hour. Subsequently, the mixture was poured into 3 liters of water. The obtained precipitate was washed repeatedly, filtered and dried in a vacuum at 40° C. for 72 hours to obtain the object PAE. The obtained PAE had a molecular weight of 72,000.

A photosensitive agent was prepared by the following steps: Triethylamine 6.7 ml (0.12 mol) was added to a dioxane solution (50 ml) containing 1,2-naphthoquinone-2-diazide-5-sulfonyl chloride 10.8 g (0.04 mol) and DDE 4.00 g (0.02 mol) dropwise, and stirred at room temperature for 3 hours. The reactant was filtered, and the filtrate was added dropwise to 2 liters of 1N hydrochloride aqueous solution to obtain a precipitate. The precipitate was filtered, and DDE-Q 12.5 g was obtained by drying the precipitate in a vacuum at 40° C. for 48 hours.

The PAE 10 g was dissolved by adding DDE-Q 2.5 g (25 wt. %) and NMP 23.2 g (NV 35%), and the positive type photosensitive resin composition varnish was obtained by filtering the solution with pressure through a filter of pore size 1.0 µm. The raw materials and composition used were listed in Table 1.

The obtained positive type photosensitive resin composition varnish was spin-coated by 2500 rpm for 30 seconds onto a non-treated surface of a silicon wafer. Subsequently, the wafer was prebaked on a hot-plate of 80° C. for 3 minutes, and a coated film 7.0 μm thick was obtained. The coated film was exposed to light by 300 mJ/cm² with a maskaligner (made by Dainippon Screen Co., MAP-1300 type, light source, made by Ushio Denki Co. UVD-405PD type super high pressure mercury lamp) via a photomask having fine patterns.

After the exposure, the film was developed by immersing it into an alkaline developing solution (2.38% aqueous solution of tetramethylammonium hydroxide) at 23° C. for 90 seconds. By washing the developed film with pure water for 30 seconds, a relief pattern 6.2 μm thick, of which the unexposed portion was not corroded, was obtained. The film was thermally treated for imide formation at 100° C./30 minutes+160° C./30 minutes+250° C./30 minutes+350° C./30 minutes with a hot blowing dryer, and a polyimide film (3.5 μm thick) having a preferable positive type relief pattern was obtained.

(Embodiment 2)

In accordance with the same method as the embodiment 1 except using the composition indicated in Table 1, the PAE of Mw 51,000 was synthesized, and the positive type photosensitive resin composition varnish was prepared. The photosensitive agent, i.e. AMP-Q, was synthesized by the following process.

A pyridine solution (200 ml) containing 4-aminophenol 6.35 g (0.058 mol) was added dropwise to a pyridine solution (100 ml) containing 1.2-naphthoquinone-2-diazide-5-sulfonyl chloride 21.9 g (0.081 mol), while keeping the temperature of the reactant below 5° C., and agitated for 30 minutes. Subsequently, triethylamine 6.7 ml (0.12 mol) was added and agitated at room temperature for 3 hours. Then, the reactant of a pyridine solution (100 ml) containing 1.2-naphthoquinone-2-diazide-5-sulfonyl chloride 15.6 g (0.058 mol) and triethylamine 15 ml was added dropwise, while keeping the temperature of the reactant below 15° C., and agitated for 3 hours. After filtration, a precipitate was obtained by adding the filtrate to a 1N hydrochloric acid aqueous solution of 5 liters. The precipitate was filtered, and AMP-Q 24.3 g was obtained by drying the precipitate in a vacuum at 40° C. for 48 hours.

In accordance with the same method as the embodiment 1, a polyimide film was formed with the prepared positive type photosensitive resin composition varnish. As a result, a polyimide film (3.8 μm thick) having a preferable positive type relief pattern, of which the unexposed portion was not corroded, was obtained.

(Embodiment 3)

In accordance with the same method as the embodiment 1 except using the composition indicated in Table 1, the PAE of Mw 22,000 was synthesized, and the positive type photosensitive resin composition varnish was prepared. The photosensitive agent, i.e. MEDA-Q, was synthesized by the following process.

A dioxane solution (50 ml) containing N-methylenediamine 0.644 g (0.0086 mol) was added dropwise to a dioxane solution (50 ml) containing 1.2-naphthoquinone-2-diazide-5-sulfonyl chloride 5.52 g (0.02 mol), while keeping the temperature of the reactant below −20° C., and agitated for 30 minutes. After returning the temperature of the reactant to room temperature, triethylamine 1.3 ml (0.011 was added and agitated at room temperature for 1 hour. After filtration, a precipitate was obtained by adding the filtrate to a 1N hydrochloric acid aqueous solution of 1 liter. The precipitate was filtered, and MEDA-Q 2.10 g was obtained by drying the precipitate in vacuum at 40° C. for 48 hours.

In accordance with the same method as the embodiment 1, a polyimide film was formed with the prepared positive type photosensitive resin composition varnish. As a result, a polyimide film (3.6 μm thick) having a preferable positive type relief pattern, of which the unexposed portion was not corroded, was obtained.

(Embodiment 4)

In accordance with the same method as the embodiment 1 except using the composition indicated in Table 1, the PAE of Mw 20,000 was synthesized, and the positive type photosensitive resin composition varnish was prepared. The photosensitive agent, i.e. AME-Q, was synthesized by the following process.

A pyridine solution (5 ml) containing N-aminoethanol 0.648 g (0.0106 mol) was added dropwise to a pyridine solution (15 ml) containing 1.2-naphthoquinone-2-diazide-5-sulfonyl chloride 6.62 g (0.024 mol), while keeping the temperature of the reactant below −25° C., and agitated for 30 minutes. After returning the temperature of the reactant to room temperature, triethylamine 6.7 ml (0.12 mol) was added and agitated for 3 hours. After filtration, a precipitate was obtained by adding the filtrate to a 1N hydrochloric acid aqueous solution of 1 liter. The precipitate was filtered, and AME-Q 2.55 g was obtained by drying the precipitate in a vacuum at 40° C. for 48 hours.

In accordance with the same method as the embodiment 1, a polyimide film was formed with the prepared positive type photosensitive resin composition varnish. As a result, a polyimide film (3.6 μm thick) having a preferable positive type relief pattern, of which the unexposed portion was not corroded, was obtained.

(Embodiment 5)

In accordance with the same method as the embodiment 1 except using the composition indicated in Table 1, the PAE of Mw 19,000 and DDE-Q was synthesized, and the positive type photosensitive resin composition varnish was prepared.

In accordance with the same method as the embodiment 1, a polyimide film was formed with the prepared positive type photosensitive resin composition varnish. As a result, a polyimide film (3.7 μm thick) having a preferable positive type relief pattern, of which the unexposed portion was not corroded, was obtained.

(Embodiment 6)

In accordance with the same method as the embodiment 1 except using the composition indicated in Table 1, the PAE of Mw 20,000 and DDE-Q was synthesized, and the positive type photosensitive resin composition varnish was prepared.

In accordance with the same method as the embodiment 1, a polyimide film was formed with the prepared positive type photosensitive resin composition varnish. As a result, a polyimide film (3.5 μm thick) having a preferable positive type relief pattern, of which the unexposed portion was not corroded, was obtained.

(Embodiment 7)

In accordance with the same method as the embodiment 1 except using the composition indicated in Table 1, the PAE of Mw 20,000 and DDE-Q was synthesized, and the positive type photosensitive resin composition varnish was prepared.

In accordance with the same method as the embodiment 1, a polyimide film was formed with the prepared positive type photosensitive resin composition varnish. As a result, a polyimide film (3.5 μm thick) having a preferable positive type relief pattern, of which the unexposed portion was not corroded, was obtained.

(Embodiment 8)

In accordance with the same method as the embodiment 1 except using the composition indicated in Table 1 and DAPP instead of DDE, the PAE of Mw 46,000 was synthesized, and with the same method as the embodiment 2, AMP-Q was synthesized. Then, the positive type photosensitive resin composition varnish was prepared.

In accordance with the same method as the embodiment 1, a polyimide film was formed with the prepared positive type photosensitive resin composition varnish. As a result, a polyimide film (3.5 μm thick) having a preferable positive type relief pattern, of which the unexposed portion was not corroded, was obtained.
(Embodiment 9)

In accordance with the same method as the embodiment 1 except using the composition indicated in Table 1, the PAE of Mw 155,000 was synthesized, and with the same method as the embodiment 3, MEDA-Q was synthesized. Then, the positive type photosensitive resin composition varnish was prepared.

In accordance with the same method as the embodiment 1, a polyimide film was formed with the prepared positive type photosensitive resin composition varnish. As the a result, a polyimide film (3.6 μm thick) having a preferable positive type relief pattern, of which the unexposed portion was not corroded, was obtained.
(Embodiment 10)

In accordance with the same method as the embodiment 1 except using the composition indicated in Table 1, the PAE of Mw 21,000 was synthesized, and with the same method as the embodiment 3, MEDA-Q was synthesized. Then, the positive type photosensitive resin composition varnish was prepared.

In accordance with the same method as the embodiment 1, a polyimide film was formed with the prepared positive type photosensitive resin composition varnish. As a result, a polyimide film (3.5 μm thick) having a preferable positive type relief pattern, of which the unexposed portion was not corroded, was obtained.
(Embodiment 11)

In accordance with the same method as the embodiment 1 except using the composition indicated in Table 1, the PAE of Mw 22,000 was synthesized, and with the same method as the embodiment 4, AME-Q was synthesized. Then, the positive type photosensitive resin composition varnish was prepared.

In accordance with the same method as the embodiment 1, a polyimide film was formed with the prepared positive type photosensitive resin composition varnish. As a result, a polyimide film (3.6 μm thick) having a preferable positive type relief pattern, of which the unexposed portion was not corroded, was obtained.
(Embodiment 12)

In accordance with the same method as the embodiment 1 except using the composition indicated in Table 1, the PAE of Mw 19,000 was synthesized, and with the same method as the embodiment 4, AME-Q was synthesized. Then, the positive type photosensitive resin composition varnish was prepared.

In accordance with the same method as the embodiment 1, a polyimide film was formed with the prepared positive type photosensitive resin composition varnish. As a result, a polyimide film (3.6 μm thick) having a preferable positive type relief pattern, of which the unexposed portion was not corroded, was obtained.
(Comparative example 1)

In accordance with the same method as the embodiment 1 except using the PAE used in the embodiment 1 and 4 NT-300, which was a sulfonic ester of O-quinonediazide, the positive type photosensitive resin composition varnish was prepared, and the polyimide film was formed. Necessary exposure dose in this case was 500 mJ/cm$^2$.

The unexposed portion of the obtained polyimide film (3.4 μm thick) was corroded, and the positive type relief pattern was not preferable.
(Comparative example 2)

In accordance with the same method as the embodiment 1 except using the composition indicated in Table 1 (alcohol: MeOH), the PAE of Mw 23,000 and DDE-Q were synthesized. Then, the positive type photosensitive resin composition varnish was prepared.

In accordance with the same method as the embodiment 1, a polyimide film was formed with the prepared positive type photosensitive resin composition varnish. As a result, the unexposed portion of the obtained polyimide film (3.3 μm thick) was corroded, and the positive type relief pattern was not preferable.
(Comparative example 3)

In accordance with the same method as the embodiment 1 except using the composition indicated in Table 1 (DADB: 40%), the PAE of Mw 23,000 was synthesized, and with the same method as the embodiment 4, AME-Q was synthesized. Then, the positive type photosensitive resin composition varnish was prepared.

In accordance with the same method as the embodiment 1, a polyimide film was formed with the prepared positive type photosensitive resin composition varnish. The necessary developing time was as long as 6~7 minutes, and the positive type relief pattern of the obtained polyimide film (3.3 μm thick) was not preferable.
(Comparative example 4)

In accordance with the same method as the embodiment 1 except using the composition indicated in Table 1 (DADB: 95%), the PAE of Mw 18,000 and DDE-Q were synthesized, and the positive type photosensitive resin composition varnish was prepared.

In accordance with the same method as the embodiment 1, a polyimide film was formed with the prepared positive type photosensitive resin composition varnish. The necessary developing time was as short as a few seconds, and the positive type relief pattern of the obtained polyimide film (3.3 μm thick) was not preferable.
(Reference example 1) In accordance with the same method as the embodiment 1 except adding aniline 0.32 g, i.e. an end capping agent, to butylester chloride of 3,3',4,4'-benzophenonetetracarboxylic acid 27.2 g, the PAE was synthesized. The obtained PAE had a Mw of 7,000. Further, in accordance with the embodiment 1, DDE-Q was synthesized, and the positive type photosensitive resin composition varnish was prepared with the PAE and the DDE-Q.

In accordance with the same method as the embodiment 1, a polyimide film (3.0 μm thick) was formed with the prepared positive type photosensitive resin composition varnish. However, as the Mw of the used PAE was as small as 7,000, the obtained polyimide film was not durable in practical use.
(Reference example 2)

In accordance with the same method as the embodiment 1 except using NMP, of which the water content was controlled at the utmost to 10 ppm, and adding the acid chloride solution dropwise to the diamine solution, which was maintained at below −18° C., for 3 hours, the PAE was synthesized. The obtained PAE had Mw of 235,000. Further, in accordance with the embodiment 1, DDE-Q was synthesized, and the positive type photosensitive resin composition varnish was prepared with the PAE and the DDE-Q.

In accordance with the same method as the embodiment 1, a polyimide film (3.5 μm thick) was formed with the prepared positive type photosensitive resin composition varnish. However, as the Mw of the used PAE was excessively large, the developing time was as long as 3.5 minutes, and the obtained positive type relief pattern was not preferable.

TABLE 1

| | Acid dian-hydride | Alcohol | Mixed ratio of (DADB/DDE/BAT) | Photosensitive agent (wt. %) |
|---|---|---|---|---|
| Embodiment 1 | BTDA | 1-BuOH | 60/35/5 | DDE-Q (25) |
| Embodiment 2 | BTDA | 1-BuOH | 60/30/10 | AMP-Q (30) |
| Embodiment 3 | BTDA | 1-PrOH | 70/25/5 | MEDA-Q (30) |
| Embodiment 4 | BTDA | 1-PrOH | 70/18/12 | AME-Q (25) |
| Embodiment 5 | BTDA | 1-HeOH | 80/15/5 | DDE-Q (30) |
| Embodiment 6 | BTDA | 1-DoOH | 85/10/5 | DDE-Q (25) |
| Embodiment 7 | BTDA | 1-PrOH | 85/10/5 | DDE-Q (25) |
| Embodiment 8 | ODPA | 1-BuOH | 70/25*/5 | AMP-Q (40) |
| Embodiment 9 | ODPA | 1-PrOH | 55/35/10 | MEDA-Q (20) |
| Embodiment 10 | ODPA | 1-HeOH | 75/20/5 | MEDA-Q (30) |
| Embodiment 11 | ODPA | 1-OcOH | 80/15/5 | AME-Q (10) |
| Embodiment 12 | BPDA | 1-BuOH | 75/20/5 | AME-Q (35) |
| Comp. ex. 1** | BTDA | 1-BuOH | 60/35/5 | 4NT-300 35 |
| Comp. ex. 2 | BTDA | MeOH | 60/35/5 | DDE-Q (30) |
| Comp. ex. 3 | ODDA | 1-HeOH | 40/55/5 | AME-Q (35) |
| Comp. ex. 4 | BTDA | 1-BuOH | 95/0/5 | DDE-Q (25) |

*DAPP,
**Comparative example (Embodiment 13)

A resin sealed semiconductor device was manufactured using the positive type photosensitive resin composition varnish obtained by the embodiment 1. A set of schematic illustrations of the manufacturing processes is indicated in FIGS. 1(a)~1(d).

FIG. 1(a) A stratified substrate of LSI chip 2 (length: 5 mm×width: 5 mm) on a tab 3, bonding pads 1a,1b (length: 120 μm×width: 120 μm) on the LSI chip 2, was prepared.

Figure 1B:
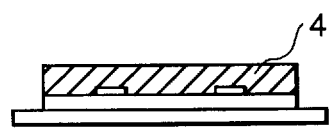

FIG. 1(b) The positive type photosensitive resin composition varnish 4 was applied onto the surface of the LSI chip 2 by a spin-coater with the condition of 2600 rpm for 30 seconds.

Figure 1C:
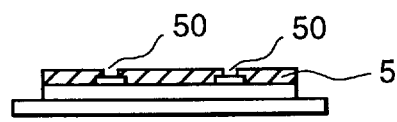

FIG. 1(c) After prebaking on a hot plate at 80° C. for 3 minutes, the applied varnish is exposed to light by 300 mJ/cm² with a maskaligner (made by Dainippon Screen Co., MAP-1300 type, light source, made by Ushio Denki Co. UVD-405PD type super high pressure mercury lamp) via a photomask having through-holes (length: 100 μm×width: 100 μm ) at locations corresponding to the bonding pad 1b. Then, the exposed varnish was developed by immersing it into an alkaline aqueous solution (2.38% aqueous solution of tetramethylammonium hydroxide) at 23° C. for 1.5 minutes. Then, the film was washed with pure water for 30 seconds, and a relief pattern (5.8 μm thick) having through holes (length: 99 μm×width: 99 μm ), of which the unexposed portion was not corroded, was obtained. The film was thermally treated for imide formation at 100° C./30 minutes+160° C./30 minutes+250° C./30 minutes+350° C./30 minutes with a hot blowing dryer, and a polyimide film (3.5 μm thick) having a preferable positive type relief pattern was obtained.

Figure 1D:
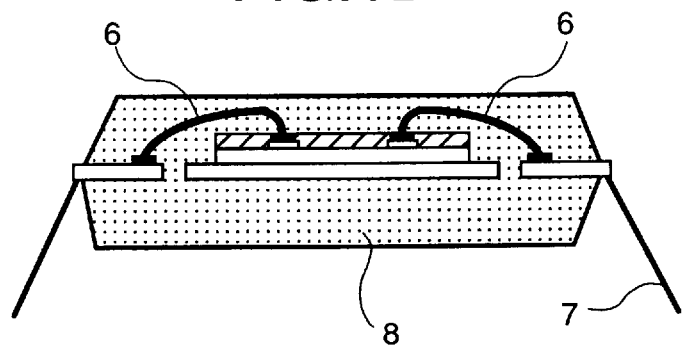

FIG. 1(d) The bonding pad 1b was connected with lead frame 7 by a bonding wire 6 (diameter: 25 μm ) through the through-hole 50. Then the resin sealed semiconductor device was formed by molding the whole body with a sealing agent 8 (RM370, made by Hitachi Kasei Co.).

In accordance with the present invention, a polyimide film having preferable positive type relief patterns, of which the unexposed portion is not corroded, can be obtained.

What is claimed is:

1. A positive photosensitive resin composition, which can be developed by an alkaline aqueous solution, comprising
   a polyamic acid ester expressed by the following general formula (I):

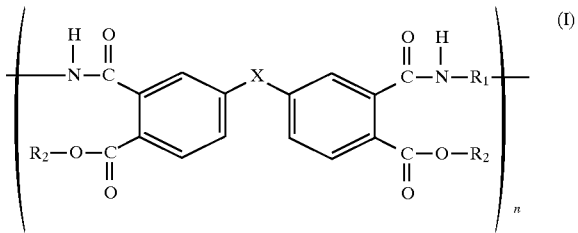

where, $R_1$: a divalent organic group (however, 55~85 mol % of the $R_1$ contain carboxyl group)
$R_2$: a hydrophobic group
X: —O—, —C(=O)—, or direct bond
n: 6~570 an o-quinonediazidesulfonyl amide compound expressed by the following general formula (II):

where, $R_3$: an o-quinonediazidesulfonic group
$R_4$: an organic group of carbon atoms 2~30
$R_5$: an alkyl group or hydrogen
m: 1~6 and/or an o-quinonediazidesulfonyl amide sulfonic ester compound expressed by the following general formula (III):

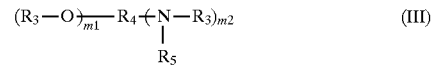

where, $R_3$: an o-quinonediazidesulfonic group
$R_4$: an organic group of carbon atoms 2~30
$R_5$: an alkyl group or hydrogen
$m_1$: 1~5
$m_2$: 1~6.

2. A positive photosensitive resin composition as claimed in claim 1, wherein
   the mixing ratio of said o-quinonediazidesulfonyl amide compound and/or said o-quinonediazidesulfonyl amide sulfonic ester compound to said polyamic acid ester is in the range of 5~40% by weight.

3. A positive photosensitive resin composition varnish comprising the positive type photosensitive resin composition, claimed in any of claims 1 and 2, and wherein organic solvent, and total concentration of said polyamic acid ester, said o-quinonediazidesulfonyl amide compound, and/or said o-quinonediazidesulfonyl amide sulfonic ester compound is in the range of 5~40% by weight.

4. Polyimide film manufactured with the positive photosensitive resin composition varnish as claimed in claim 3.

5. A method of manufacturing a polyimide film comprising the steps of:
   applying the positive photosensitive resin composition varnish as claimed in claim 3 onto a surface of a solid body;
   prebaking the solid body;
   exposing the varnish to light using a photomask having a desired pattern;
   etching the exposed varnish with an alkaline aqueous solution; and treating the solid body with heat.

6. An electronic device having an insulating layer, and including the polyimide film, as claimed in claim 4, as said insulating layer.

7. A positive photosensitive resin composition as claimed in claim 1, wherein $R_2$ is a hydrophobic compound selected from the group consisting of an alkyl group having 3 to 12 carbon atoms, a cycloaliphatic hydrocarbon group, an aromatic group and a fluorinated alkyl group.

8. A positive photosensitive resin composition as claimed in claim 1, wherein $R_1$ is a diamine with an adjacent —NH group.

9. A positive photosensitive resin composition as claimed in claim 8, wherein $R_1$ is a diamine with an adjacent —NH group selected from the group consisting of 3,5-diaminobenzoic acid, 2,5-diaminoterephthalic acid, p-phenylenediamine, p,p'-diaminophenylether, p'-diamino-ter-phenyl, bis[4-(3-aminophenoxy)phenylsulfon], 2,4-diamino-toluene, m,m'-diaminobenzophenone, m-phenylenediamine, 2,2'-bis[(4-p-aminophenoxy)phenyl] propane, bis-4-aminophenoxy-4-phenylsulfone, 3,3'-diaminobenzophenone, 2,2'-bis[4-(3-aminophenoxy) phenyl]hexafluoropropane, 1,3-bis(3-aminophenoxy) benzene, 2,2-bis[(aminophenoxy)phenyl]propane.

10. A polyimide film, produced by a process comprising:
(a) applying a positive photosensitive resin composition varnish comprising a photosensitive resin composition including a polyamic acid ester expressed by the following general formula (I):
where, $R_1$: a divalent organic group (however, 55~85 mol % of the $R_1$ contain carboxyl group)
$R_2$: a hydrophobic group
X: —O—, —C(=O)—, or direct bond
n: 6~570 an o-quinonediazidesulfonyl amide compound expressed by the following general formula (II):

where, $R_3$: an o-quinonediazidesulfonic group
$R_4$: an organic group of carbon atoms 2~30
$R_5$: an alkyl group or hydrogen
m: 1~6 and/or an o-quinonediazidesulfonyl amide sulfonic ester compound expressed by the following general formula (III):

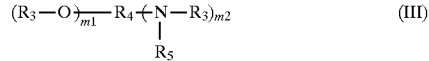

where, $R_3$: an o-quinonediazidesulfonic group
$R_4$: an organic group of carbon atoms 2~30
$R_5$: an alkyl group or hydrogen
$m_1$: 1~5
$m_2$: 1~6, and an organic solvent, wherein the total concentration of said polyamic acid ester, said o-quinonediazidesulfonyl amide compound and/or said o-quinonediazidesulfonyl amide sulfonic ester compound is in the range of 5–40% by weight, onto a surface of a solid body;
(b) prebaking the solid body;
(c) exposing the varnish to light using a photomask having a desired pattern;
(d) etching the exposed varnish with an alkaline aqueous solution; and
(e) treating the solid body with heat.

* * * * *